(12) United States Patent
Lin

(10) Patent No.: US 9,935,606 B1
(45) Date of Patent: Apr. 3, 2018

(54) SYSTEM ON CHIP AND CORRECTION METHOD OF TERMINATION IMPEDANCE ELEMENT THEREOF

(71) Applicant: ALi Corporation, Hsinchu (TW)

(72) Inventor: Yu-Hsiang Lin, Taipei (TW)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 15/373,348

(22) Filed: Dec. 8, 2016

(30) Foreign Application Priority Data

Sep. 30, 2016 (CN) .......................... 2016 1 0867804

(51) Int. Cl.
*H03K 17/16* (2006.01)
*H03H 7/38* (2006.01)

(52) U.S. Cl.
CPC ..................... *H03H 7/38* (2013.01)

(58) Field of Classification Search
CPC ....... H03K 19/0005; H03K 19/017545; G11C 7/1057; G11C 7/1084
USPC .......................................................... 326/30
See application file for complete search history.

(56) References Cited

U.S. PATENT DOCUMENTS

| | | | | |
|---|---|---|---|---|
| 6,963,218 B1* | 11/2005 | Alexander | ........... | H03K 17/167 326/26 |
| 2004/0008054 A1* | 1/2004 | Lesea | .................. | H04L 25/0278 326/30 |
| 2006/0020756 A1* | 1/2006 | Tran | .................... | G06F 12/0848 711/119 |
| 2010/0073023 A1* | 3/2010 | Oh | ........................ | G11C 7/1048 326/30 |
| 2010/0327902 A1* | 12/2010 | Shau | ..................... | G11C 7/1066 326/30 |
| 2011/0241726 A1* | 10/2011 | Kim | ..................... | H04L 25/0298 326/30 |
| 2012/0113733 A1* | 5/2012 | Kim | ........................ | G11C 5/063 365/193 |
| 2013/0002291 A1* | 1/2013 | Park | ................. | H03K 19/01750 326/30 |
| 2017/0069369 A1* | 3/2017 | Kim | ..................... | G11C 11/4093 |

* cited by examiner

*Primary Examiner* — Don Le
(74) *Attorney, Agent, or Firm* — J.C. Patents

(57) ABSTRACT

A system on chip (SoC) and a correction method of termination impedance element thereof are provided. The SoC includes a pad, a first termination impedance element, and a correction circuit. The pad is coupled to an external dynamic random access memory (DRAM) chip, where the DRAM chip includes a corrected termination impedance element. The first termination impedance element is coupled to the pad. The correction circuit is coupled to a control terminal of the first termination impedance element, to control an impedance value of the first termination impedance element. During an initialization period, the correction circuit corrects the impedance value of the first termination impedance element by using the impedance value of the corrected termination impedance element.

14 Claims, 5 Drawing Sheets

SYSTEM ON CHIP AND CORRECTION METHOD OF TERMINATION IMPEDANCE ELEMENT THEREOF

CROSS-REFERENCE TO RELATED APPLICATION

This application claims the priority benefit of China application serial no. 201610867804.0, filed on Sep. 30, 2016. The entirety of the above-mentioned patent application is hereby incorporated by reference herein and made a part of this specification.

BACKGROUND

Technical Field

The present invention relates to an integrated circuit (IC), and more particularly, to a system on chip (SoC) and a correction method of termination impedance element thereof.

Description of Related Art

As integrate circuit technicians know, a variety of electrical circuits may be integrated/formed on a chip. For the purpose of communicating (e.g., exchanging data) with some other external circuits/chips by the chip (IC), the chip may be provided with a pad. The core circuit of the chip may output data signals to an external communication channel via the pad, and/or the core circuit of the chip may receive data signals transmitted through the external communication channel via the pad. Responding to the needs for high frequency communication, the chip is usually provided with a termination impedance element for matching impedance with an external electrical element connected to the external communication channel.

Before a transmission is performed between the chip and the external electrical element, an initialization process is usually performed first to correct an impedance value of the termination impedance element, so that the termination impedance element is impedance matching with the external electrical element. In prior art, the method for correcting the termination impedance element of the integrated circuit requires a specialized external reference resistor. Here, a print circuit board (PCB) provided with a system on chip (SoC) and a dynamic random access memory (DRAM) chip is taken as an example. The SoC is electrically connected to the DRAM chip by the wire of the PCB. One (or more) first external reference resistor specialized for the DRAM chip is also disposed on the PCB. The impedance value of the termination impedance element in the DRAM chip may be corrected by using the specialized first external reference resistor. Similarly, one (or more) second external reference resistor specialized for the SoC is also disposed on the PCB. The impedance value of the termination impedance element in the SoC may be corrected by using the specialized second external reference resistor. "Correcting an impedance value of a termination impedance element in a chip by using a specialized (additional) external reference resistor" is a well-known technique, therefore which is not repeated herein. It's fairly known that, as a result of the fact that the external reference resistor is required for each chip (integrated circuit) on the PCB, not only the cost is increased, but the area of the PCB is also occupied thereby.

SUMMARY

The present invention is directed to provide a system on chip (SoC) and a correction method of a termination impedance element thereof, which is capable for saving the specialized external reference resistor for the SoC. By using a corrected termination impedance element inside a dynamic random access memory (DRAM), an impedance value of a first termination impedance element may be corrected by the SoC.

An embodiment of the present invention provides an SoC. The SoC includes a pad, a first termination impedance element, and a correction circuit. The pad is coupled to an external DRAM chip, where the external DRAM chip includes a corrected termination impedance element. The first termination impedance element is coupled to the pad. The correction circuit is coupled to a control terminal of the first termination impedance element, to control an impedance value of the first termination impedance element. During an initialization period, the correction circuit corrects the impedance value of the first termination impedance element by using the impedance value of the corrected termination impedance element.

Another embodiment of the present invention provides a correction method of termination impedance element of an SoC. The correction method of termination impedance element of the SoC includes the following steps: providing a first termination impedance element of the SoC coupled to a corrected termination impedance element in an external DRAM chip; and during an initialization period, correcting an impedance value of the first termination impedance element by a correction circuit using an impedance value of the corrected termination impedance element.

Based on the above, the SoC and the correction method of termination impedance element thereof provided in the embodiments of the present invention may correct the first termination impedance element inside the SoC by using the corrected termination impedance element inside the DRAM chip. Accordingly, the specialized external reference resistor for the SoC may be saved when correcting the first termination impedance element. Further, since the first termination impedance element of the SoC 100 is corrected by using the corrected termination impedance element inside the DRAM chip, the first termination impedance element of the SoC and the corrected termination impedance element of the DRAM chip depends more on each other and the impedances thereof are more match with each other.

To make the above features and advantages of the present invention more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
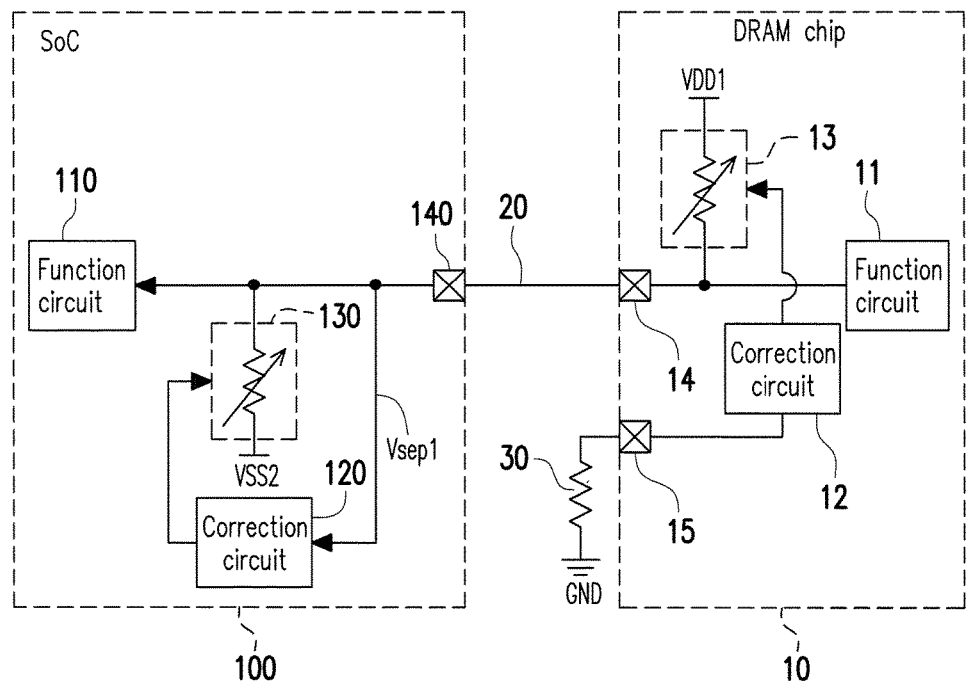
FIG. 1 is a schematic circuit block diagram illustrating a system on chip (SoC) and a dynamic random access memory (DRAM) chip according to an embodiment of the present invention.

Reference will now be made in detail to the present preferred embodiments of the disclosure, examples of which are illustrated in the accompanying drawings. Wherever possible, the same reference numbers are used in the drawings and the description to refer to the same or like parts.

The term "coupling/coupled" used in this specification (including claims) of the disclosure may refer to any direct or indirect connection means. For example, "a first device is coupled to (or connected to) a second device" should be interpreted as "the first device is directly connected to the second device" or "the first device is indirectly connected to the second device through other devices or connection means."

Please refer to FIG. 1, FIG. 1 is a schematic circuit block diagram illustrating system on chip (SOC) 100 and dynamic random access memory (DRAM) chip 10 according to an embodiment of the present invention. In the embodiment of FIG. 1, DRAM chip 10 includes function circuit 11, correction circuit 12, termination impedance element 13, memory chip pad 14 and memory chip pad 15. A communication terminal of function circuit 11 may output data signal to communication channel 20 via memory chip pad 14, and/or function circuit 11 may receive data signal transmitted through communication channel 20 via memory chip pad 14. The communication channel 20 may be a wire of a print circuit board (PCB). A first terminal of termination impedance element 13 is couple to memory chip pad 14. A second terminal of termination impedance element 13 is coupled to first voltage rail line VDD1 in DRAM chip 10. Correction circuit 12 may correct an impedance value of termination impedance element 13 to perform an impedance matching process.

During an initialization period, termination impedance element 13 of DRAM chip 10 needs to be corrected. In the embodiment of FIG. 1, DRAM chip 10 is provided with one (or more) specialized external reference resistor 30. The external reference resistor 30 is also disposed on the PCB. The external reference resistor 30 is coupled between memory chip pad 15 and ground point GND. A first terminal and a second terminal of correction circuit 12 are respectively coupled to memory chip pad 15 and a control terminal of termination impedance element 13. According to an impedance value of the specialized external reference resistor 30, correction circuit 12 may correct the impedance value of termination impedance element 13 inside DRAM chip 10. "Correcting the impedance value of termination impedance element 13 in DRAM chip 10 by correction circuit 12 using the specialized (additional) external reference resistor 30" is a well-known technique, therefore which is not repeated herein. After the correction is completed, termination impedance element 13 may be referred as a "corrected termination impedance element".

SoC 100 includes a function circuit 110, a correction circuit 120, a first termination impedance element 130 and a pad 140. The pad 140 is coupled to the memory chip pad 14 of the external DRAM chip 10 by the communication channel 20. A communication terminal of the function circuit 110 may receive data signal from the communication channel 20 via the pad 140, and/or the function circuit 110 may output data signal to the communication channel 20 via pad 140. A first terminal and a second terminal of the first termination impedance element 130 is respectively coupled to the pad 140 and second voltage rail line VSS2 of the SoC 100. After correcting the impedance value of the termination impedance element 13 in the DRAM chip 10 via the external reference resistor 30, then an impedance value of first termination impedance element 130 is corrected by using the corrected termination impedance element 13 of DRAM chip 10.

Figure 2:
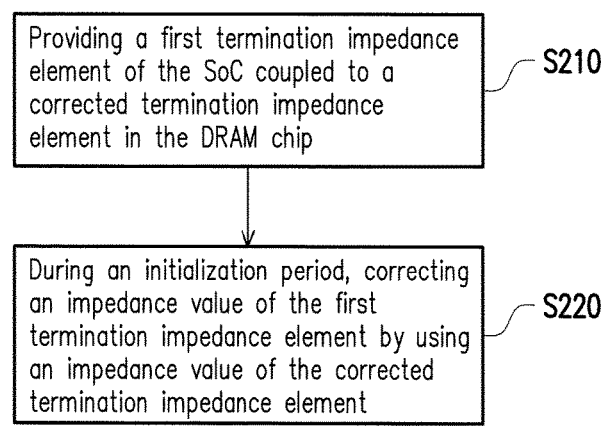
FIG. 2 is a flowchart illustrating a correction method of a termination impedance element of a SoC according to an embodiment of the present invention.

FIG. 2 is a flowchart illustrating a correction method of a termination impedance element of a SoC according to an embodiment of the present invention. Please refer to FIG. 1 and FIG. 2, in step S210, a first termination impedance element 130 of the SoC 100 coupled to the corrected termination impedance element 13 of the external DRAM chip 10 is provided. During an initialization period, SoC 100 may wait DRAM chip 10 to perform an impedance matching process based on the external reference resistor 30, until the termination impedance element 13 of DRAM chip 10 is corrected and becomes corrected termination impedance element 13. Then, the correction circuit 120 of the SoC 100 may correct an impedance value of the first termination impedance element 130 of SoC 100 by using an impedance value of the corrected termination impedance element 13 (S220). Accordingly, SoC 100 does not require any specialized external reference resistor when correcting the first termination impedance element 130. Further, since the first termination impedance element 130 of SoC 100 is corrected by using the corrected termination impedance element 13 inside DRAM chip 10, the first termination impedance element 130 of SoC 100 and corrected termination impedance element 13 of DRAM chip 10 depends more on each other and the impedances thereof are more match with each other.

A voltage of the first voltage rail line VDD1 of DRAM chip 10 is different from a voltage of the second voltage rail line VSS2 of SoC 100. For example (but not limited to), the voltage of first voltage rail line VDD1 of DRAM chip 10 may be a system voltage (e.g., 1.2V, 1.5V or other voltage level). And the voltage of the second voltage rail line VSS2 of SoC 100 may be a ground voltage (e.g., 0V or other voltage level). In some embodiments, correction circuit 120 is further coupled to pad 140 of SoC 100 to measure first division voltage Vsep1 between the corrected termination impedance element 13 and the first termination impedance element 130. The correct circuit 120 correspondingly adjusts the impedance value of the first termination impedance element 130 according to the first division voltage Vsep1.

Figure 3:
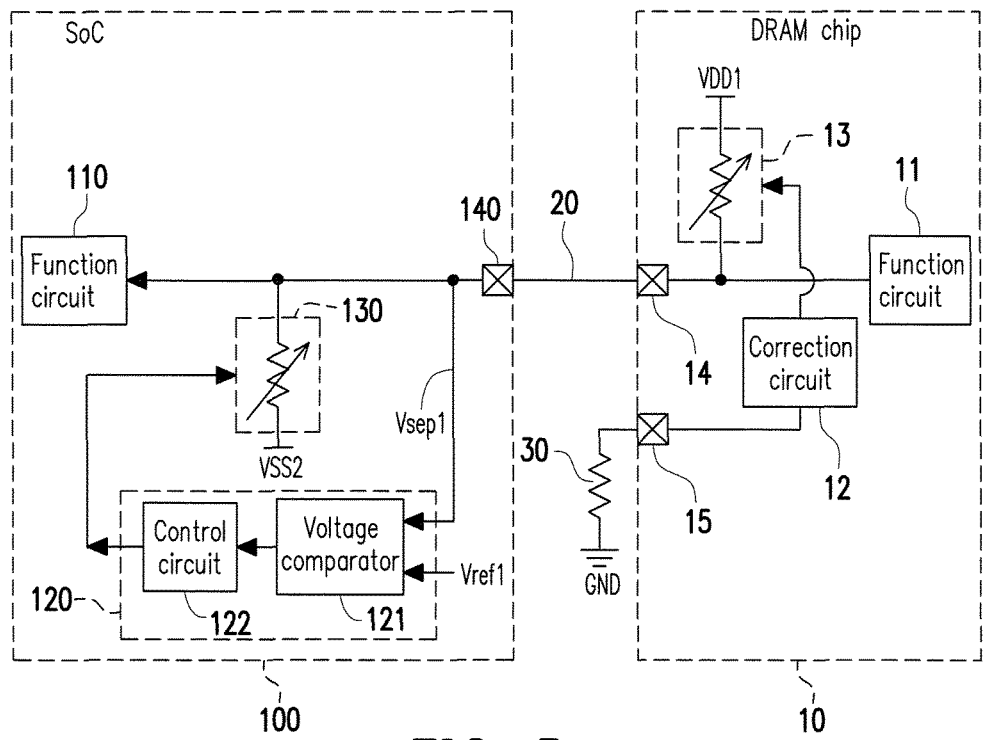
FIG. 3 is a schematic circuit block diagram illustrating a SoC and a DRAM chip according to an embodiment of the present invention.

FIG. 3 is a schematic circuit block diagram illustrating a SoC and a DRAM chip according to an embodiment of the present invention. Comparing to FIG. 1, the correction circuit 120 depicted in FIG. 3 further includes a voltage comparator 121 and a control circuit 122, the rest part of FIG. 3 is same as FIG. 1, which is not repeated herein. A first input terminal of voltage comparator 121 is coupled to the pad 140, so as to receive the first division voltage Vsep1. A second input terminal of the voltage comparator 121 is coupled to reference voltage Vref1. A voltage level of the reference voltage Vref1 may be determined according to design requirements. The voltage comparator 121 may compare first division voltage Vsep1 with the reference voltage Vref1, then provide the comparison result to the control circuit 122. An input terminal of the control circuit 122 is coupled to an output terminal of the voltage comparator 121, so as to receive the comparison result. According to the comparison result, the control circuit 122 may correct the impedance value of the first termination impedance element 130.

Figure 4:
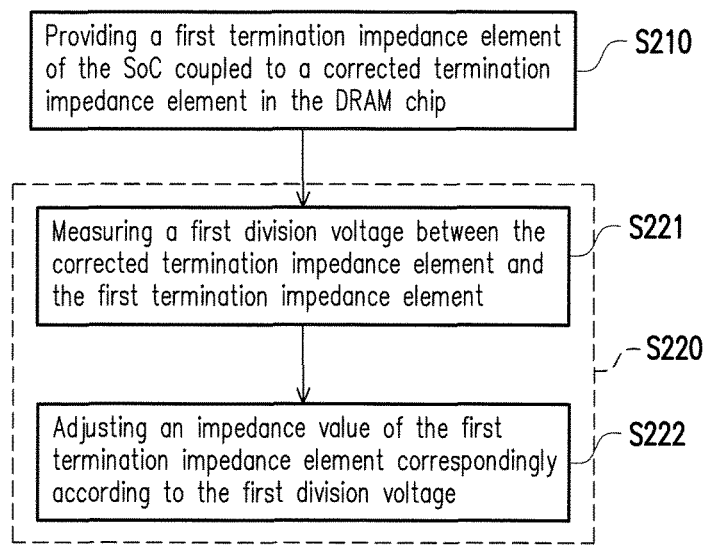
FIG. 4 is a flowchart illustrating a correction method of a termination impedance element of a SoC according to another embodiment of the present invention.

FIG. 4 is a flowchart illustrating a correction method of a termination impedance element of a SoC according to another embodiment of the present invention. Step 210 and step 220 of FIG. 4 may be referred to the related descriptions of FIG. 2, therefore which are not repeated herein. In the embodiment of FIG. 4, step S220 includes sub-steps S221 and S222. Please refer to FIG. 3 and FIG. 4, in step S221, the voltage comparator 121 of the correction circuit 120 may measure the first division voltage Vsep1 between the corrected termination impedance element 13 and the first termination impedance element 130. In step S222, the correct circuit 120 may correspondingly adjust the impedance value of the first termination impedance element 130 according to the first division voltage Vsep1. In detail, the voltage comparator 121 may compare the first division voltage Vsep1 with the reference voltage Vref1 to obtain a comparison result. The control circuit 122 correspondingly adjusts the impedance value of the first termination impedance element 130 according to the comparison result outputted from the voltage comparator 121. For example (but not limited to), the impedance value of the first termination impedance element 130 may be increased when the first division voltage Vsep1 is lower than the reference voltage Vref1. The impedance value of the first termination impedance element 130 may be decreased when first division voltage Vsep1 is higher than the reference voltage Vref1.

Figure 5:
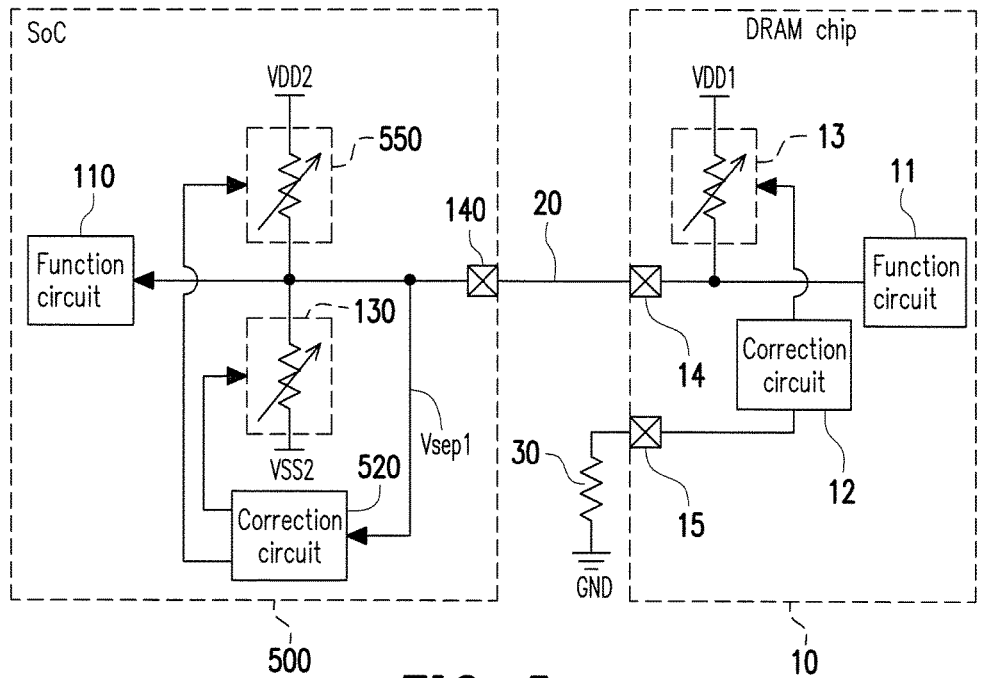
FIG. 5 is a schematic circuit block diagram illustrating a SoC and a DRAM chip according to another embodiment of the present invention.

FIG. 5 is a schematic circuit block diagram illustrating SoC 100 and DRAM chip 10 according to another embodiment of the present invention. The DRAM chip 100, communication channel 20 and external reference resistor 30 of FIG. 5 may be referred to the related descriptions of FIG. 1, therefore which are not repeated herein. SoC 500 of FIG. 5 includes a function circuit 110, a correction circuit 520, a first termination impedance element 130, a second termination impedance element 550 and a pad 140. The function circuit 110, correction circuit 520, first termination impedance element 130 and pad 140 of FIG. 5 may be deduced by the related descriptions of the function circuit 110, correction circuit 120, first termination impedance element 130 and pad 140 of FIG. 1 and FIG. 3, therefore which are not repeated herein. In the embodiment of FIG. 5, the correction circuit 520 may be coupled to a control terminal of the second termination impedance element 550, so as to adjust an impedance value of the second termination impedance element 550. A first terminal of the second termination impedance element 550 is coupled to the pad 140, and a second terminal of the second termination impedance element 550 is coupled to first voltage rail line VDD2. A voltage of the first voltage rail line VDD2 is different from a voltage of the second voltage rail line VSS2. For example (but not limited to), the voltage of the first voltage rail line VDD2 may be a system voltage (e.g., 1.2V, 1.5V or other voltage level), and the voltage of the second voltage rail line VSS2 may be a ground voltage (e.g., 0V or other voltage levels).

Figure 6:
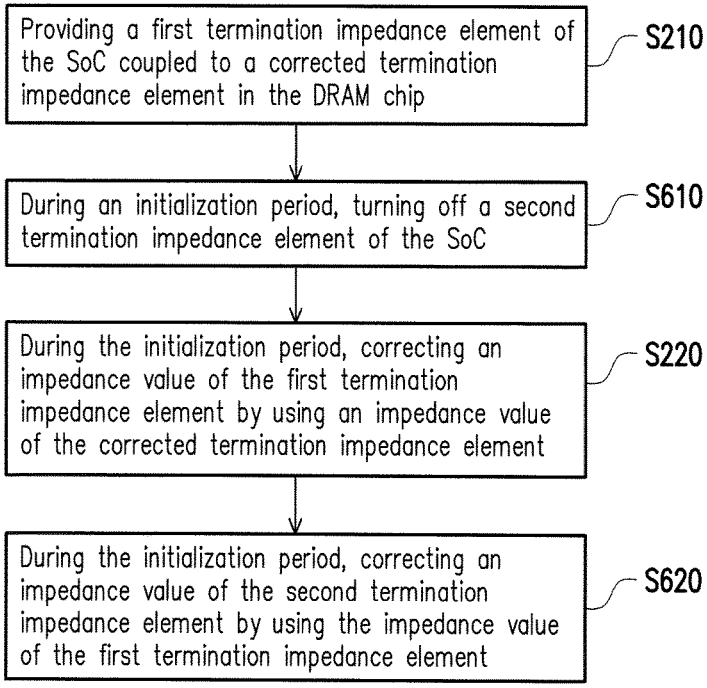
FIG. 6 is a flowchart illustrating a correction method of a termination impedance element of a SoC according to still another embodiment of the present invention.

FIG. 6 is a flowchart illustrating a correction method of a termination impedance element of a SoC according to still another embodiment of the present invention. Please refer to FIG. 5 and FIG. 6, in step S210, the first termination impedance element 130 of SoC 500 is coupled to the corrected termination impedance element 13 of the external DRAM chip 10. During an initialization period, the correction circuit 520 may turn off the second termination impedance element 550 of the SoC 500 (S610). The second termination impedance element 550 is turned off, which means that second termination impedance element 550 is in an open state (an impedance value thereof may be regarded as infinite ideally). In step S220 of FIG. 6, the correction circuit 520 may correct the impedance value of the first termination impedance element 130 by using the impedance value of the corrected termination impedance element 13 during the initialization period. Step 220 of FIG. 6 may be referred to the related descriptions of FIG. 1 to FIG. 4, therefore which is not repeated herein. During an initialization period, the correction circuit 520 may further correct an impedance value of the second termination impedance element 550 by using the impedance value of the first termination impedance element 130 (S620).

Figure 7:
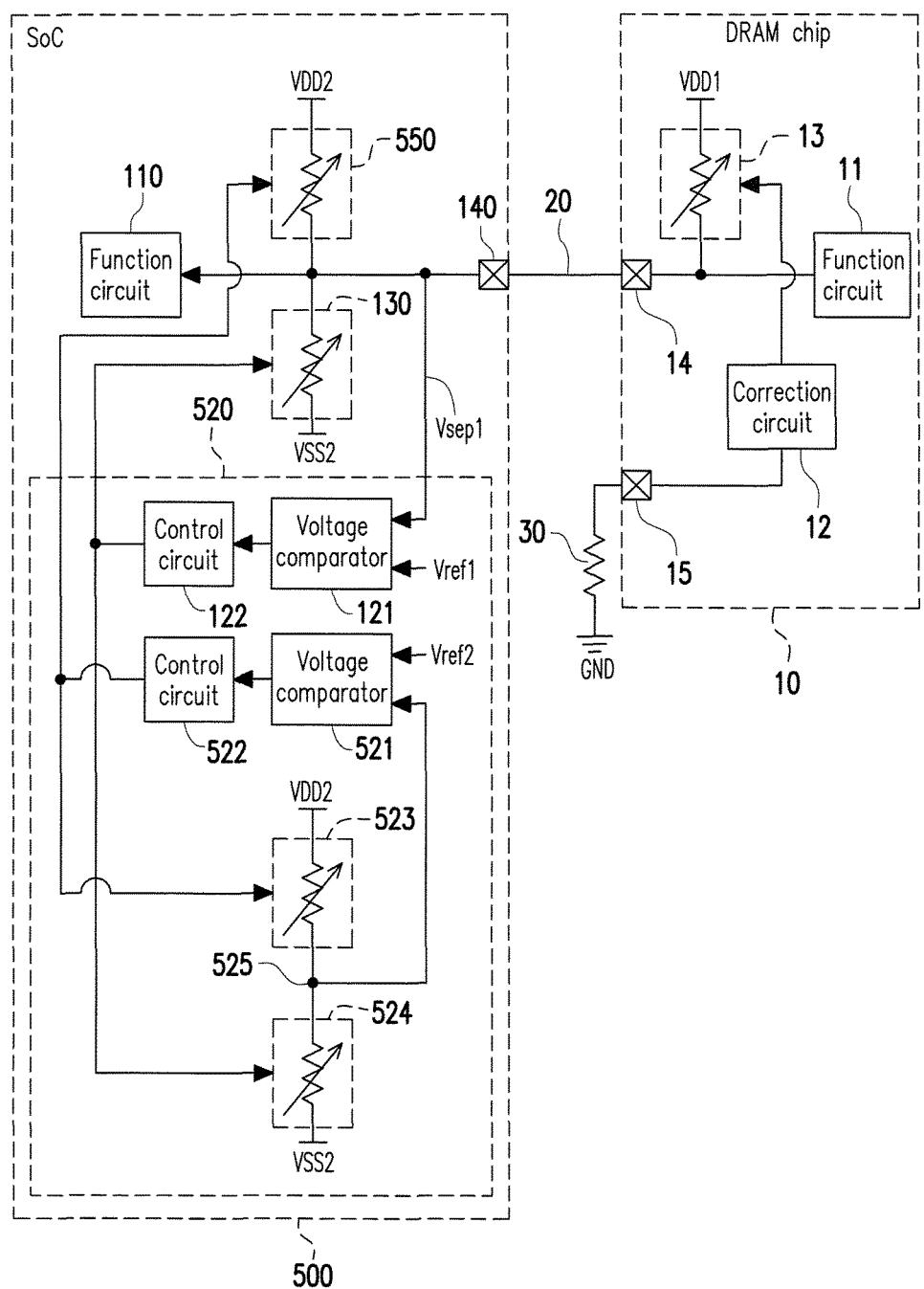
FIG. 7 is a schematic circuit block diagram illustrating the correction circuit of FIG. 5 according to an embodiment of the present invention.

FIG. 7 is a schematic circuit block diagram illustrating correction circuit 520 of FIG. 5 according to an embodiment of the present invention. In the embodiment of FIG. 7, the correction circuit 520 includes a voltage comparator 121, a control circuit 122, a voltage comparator 521, a control circuit 522, a first reference impedance element 524 and a second reference impedance element 523. A first input terminal of the voltage comparator 121 is coupled to the pad 140, so as to receive the first division voltage Vsep1. A second input terminal of the voltage comparator 121 is coupled to the reference voltage Vref1. The voltage comparator 121 and control circuit 122 of FIG. 7 may be deduced by the related descriptions of FIG. 3, therefore which are not repeated herein. In the embodiment of FIG. 7, an impedance value of the first reference impedance element 524 and an impedance value of the first termination impedance element 130 both are controlled correlatively. For example (but not limited to), a control terminal of the first reference impedance element 524 and a control terminal of the first termination impedance element 130 are together controlled by one control signal sent from the control circuit 122. During an initialization period, the correction circuit 522 may turn off the second termination impedance element 550. The control circuit 122 may correct the impedance value of the first termination impedance element 130 (and first reference impedance element 524) by using the impedance value of the corrected termination impedance element 13 during the initialization period. After correcting the impedance value of the first termination impedance element 130 (and first reference impedance element 524) is completed, the control circuit 122 may maintain the impedance configuration of the first termination impedance element 130 (and first reference impedance element 524) until the next initialization.

A first terminal of the first reference impedance element 524 is coupled to a common node 525. A second terminal of the first reference impedance element 524 is coupled to the second voltage rail line VSS2 of SoC 500. A first terminal of the second reference impedance element 523 is coupled to the common node 525. A second terminal of the second reference impedance element 523 is coupled to the first voltage rail line VDD2 of SoC 500. An impedance value of the second reference impedance element 523 and an impedance value of the second termination impedance element 550 both are controlled correlatively. For example (but not limited to), a control terminal of the second reference impedance element 523 and a control terminal of the second termination impedance element 550 are together controlled by one control signal sent from the control circuit 522.

A first input terminal of the voltage comparator 521 is coupled to the common node 525. A second input terminal of the voltage comparator 521 is coupled to the reference voltage Vref2. A voltage level of the reference voltage Vref2 may be determined according to design requirements. In some embodiments, the reference voltage Vref2 may be same as the reference voltage Vref1. The voltage comparator 521 may compare a voltage of the common node 525 with reference the voltage Vref2, then provide the comparison result to the control circuit 522. An input terminal of the control circuit 522 is coupled to an output terminal of the voltage comparator 521, so as to receive the comparison result. An output terminal of the control circuit 522 is coupled to the control terminal of the second reference impedance element 523 and the control terminal of the second termination impedance element 550. The control circuit 522 correspondingly adjusts the impedance value of the second reference impedance element 523 (and second termination impedance element 550) according to the comparison result outputted from the voltage comparator 521. After correcting the impedance value of the second reference impedance element 523 (and second termination impedance element 550) is completed, control circuit 522 may maintain the impedance configuration of the second reference impedance element 523 (and second termination impedance element 550) until the next initialization.

In a preferred embodiment, functions of the control circuit 122 and control circuit 522 may be simultaneously implemented by one single control circuit when the reference voltage Vref2 is same as the reference voltage Vref1. Meanwhile, functions of the voltage comparator 121 and voltage comparator 521 may also be implemented by one single voltage comparator.

Figure 8:
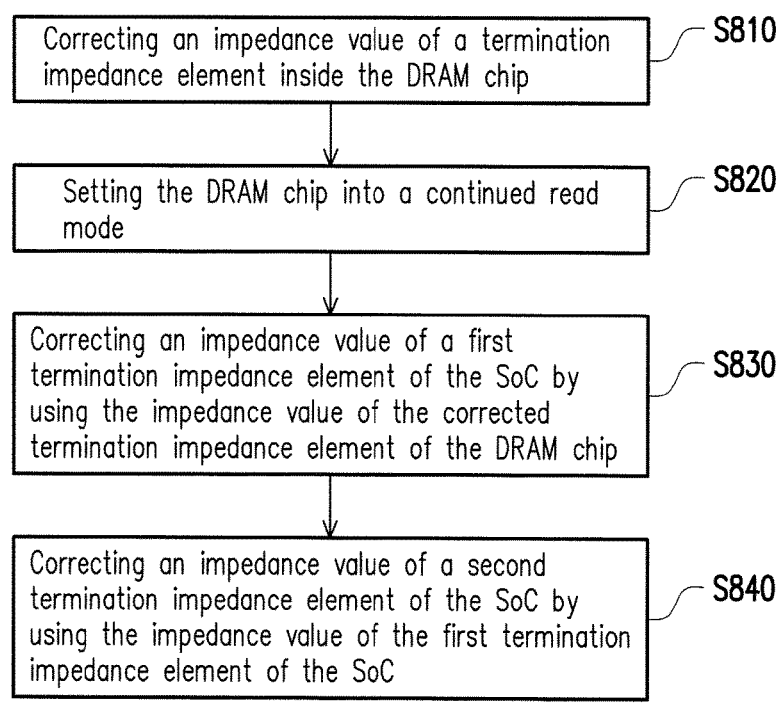
FIG. 8 is a flowchart illustrating a correction method of a termination impedance element of a SoC according to another embodiment of the present invention.

FIG. 8 is a flowchart illustrating a correction method of a termination impedance element of a SoC according to another embodiment of the present invention. Please refer to FIG. 5 and FIG. 8, according to an impedance value of the specialized external reference resistor 30, the correction circuit 12 may correct an impedance value of the termination impedance element 13 inside DRAM chip 10 in step S810. Step S810 may be performed by a well-known technique, therefore which is not repeated herein. After the impedance correction of the DRAM chip 10 and external reference resistor 30 is completed, the DRAM chip 10 is set into a continued read mode in step S820, and a function of "dynamic on-die termination (ODT)" is turned off, so as to make the ODT (e.g., termination impedance element 13) stay being turned on. After the impedance correction of the DRAM chip 10 and the external reference resistor 30 is completed, SoC 500 may correct an impedance value of the first termination impedance element 130 by using data pin (e.g., DQ pin) of the DRAM chip 10 in step S830. After impedance correction of the first termination impedance element 130 is completed, SoC 500 may correct an impedance value of the second termination impedance element 550 by using an impedance value of the corrected termination impedance element 130 in step S840. The implement details of step S830 and step S840 may be referred to the related descriptions of step S610, step S220 and step S620 of FIG. 6, and/or the related descriptions of FIG. 7, therefore which are not repeated herein.

In summary, the embodiments of the present invention provide a SoC and a correction method of termination impedance element thereof. The impedance value of corrected termination impedance element 13 in DRAM chip 10 may be used to correct first termination impedance element 130 in the SoC. Accordingly, the specialized external reference resistor for the SoC is no longer required when correcting first termination impedance element 130, and the pins required for connecting the external reference resistor are thus saved. Further, since first termination impedance element 130 of the SoC is corrected by using corrected termination impedance element 13 inside DRAM chip 10, corrected termination impedance element 13 of DRAM chip 10 and first termination impedance element 130 of the SoC depends more on each other and the impedances thereof are more match with each other.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A system on chip, comprising:
   a pad, coupled to an external dynamic random access memory chip, wherein the external dynamic random access memory chip comprises a corrected termination impedance element;
   a first termination impedance element, coupled to the pad;
   a correction circuit, coupled to a control terminal of the first termination impedance element, to control an impedance value of the first termination impedance element, wherein during an initialization period, the correction circuit corrects the impedance value of the first termination impedance element according to an impedance value of the corrected termination impedance element; and
   a second termination impedance element, wherein a first terminal of the second termination impedance element is coupled to the pad, a second terminal of the second termination impedance element is coupled to a first voltage rail line of the system on chip, and a control terminal of the second termination impedance element is coupled to the correction circuit;
   wherein during the initialization period, the correction circuit turns off the second termination impedance element, and corrects the impedance value of the first termination impedance element according to the impedance value of the corrected termination impedance element;
   wherein during the initialization period, the correction circuit corrects an impedance value of the second termination impedance element according to the impedance value of the first termination impedance element after correcting the impedance value of the first termination impedance element is completed; and
   wherein the correction circuit comprises:
   a first reference impedance element, wherein a first terminal of the first reference impedance element is coupled to a common node, and a second terminal of the first reference impedance element is coupled to a second voltage rail line of the system on chip, wherein an impedance value of the first reference impedance element and the impedance value of the first termination impedance element are controlled correlatively; and a second reference impedance element, wherein a first terminal of the second reference impedance element is coupled to the common node, and a second terminal of the second reference impedance element is coupled to the first voltage rail line of the system on chip, wherein an impedance value of the second reference impedance element and the impedance value of the second termination impedance element are both controlled correlatively.

2. The system on chip as claimed in claim 1, wherein the pad is coupled to a memory chip pad of the external dynamic random access memory chip, a first terminal of the corrected termination impedance element is coupled to the memory chip pad, a second terminal of the corrected termination impedance element is coupled to a first voltage rail line in the external dynamic random access memory chip, a first terminal of the first termination impedance element is coupled to the pad, and a second terminal of the first termination impedance element is coupled to the second voltage rail line of the system on chip.

3. The system on chip as claimed in claim 2, wherein a voltage of the first voltage rail line is different from a voltage of the second voltage rail line.

4. The system on chip as claimed in claim 3, wherein the voltage of the first voltage rail line is a system voltage, and the voltage of the second voltage rail line is a ground voltage.

5. The system on chip as claimed in claim 1, wherein the correction circuit is further coupled to the pad to measure a first division voltage between the corrected termination impedance element and the first termination impedance element, and the correct circuit correspondingly adjusts the impedance value of the first termination impedance element according to the first division voltage.

6. The system on chip as claimed in claim 1, wherein the correction circuit comprises:

a voltage comparator, wherein a first input terminal of the voltage comparator is coupled to the pad, and a second input terminal of the voltage comparator is coupled to a reference voltage; and a control circuit, wherein an input terminal of the control circuit is coupled to an output terminal of the voltage comparator, and an output terminal of the control circuit is coupled to the control terminal, wherein the control circuit correspondingly adjusts the impedance value of the first termination impedance element according to a comparison result outputted from the voltage comparator.

7. The system on chip as claimed in claim 1, wherein the correction circuit further comprises:

a voltage comparator, wherein a first input terminal of the voltage comparator is coupled to the common node, and a second input terminal of the voltage comparator is coupled to a reference voltage; and a control circuit, wherein an input terminal of the control circuit is coupled to an output terminal of the voltage comparator, and an output terminal of the control circuit is coupled to a control terminal of the second reference impedance element, wherein the control circuit correspondingly adjusts the impedance value of the second reference impedance element according to a comparison result outputted from the voltage comparator.

8. A correction method of termination impedance element of a system on chip, comprising:

coupling a first termination impedance element of the system on chip to a corrected termination impedance element in an external dynamic random access memory chip;

correcting, by a correction circuit, an impedance value of the first termination impedance element according to an impedance value of the corrected termination impedance element during an initialization period;

during the initialization period, turning off a second termination impedance element to correct the impedance value of the first termination impedance element according to the impedance value of the corrected termination impedance element, wherein a first terminal of the second termination impedance element is coupled to a first terminal of the first termination impedance element, and a second terminal of the second termination impedance element is coupled to a first voltage rail line of the system on chip; and correcting, by the correction circuit, an impedance value of the second termination impedance element according to the impedance value of the first termination impedance element after correcting the impedance value of the first termination impedance element is completed during the initialization period, wherein the step of correcting the impedance value of the second termination impedance element according to the impedance value of the first termination impedance element comprises:

controlling an impedance value of a first reference impedance element and the impedance value of the first termination impedance element correlatively, wherein a first terminal of the first reference impedance element is coupled to a common node, and a second terminal of the first reference impedance element is coupled to a second voltage rail line of the system on chip;

controlling an impedance value of a second reference impedance element and the impedance value of the second termination impedance element correlatively, wherein a first terminal of the second reference impedance element is coupled to the common node, and a second terminal of the second reference impedance element is coupled to the first voltage rail line of the system on chip.

9. The correction method of termination impedance element as claimed in claim 8, wherein a pad of the system on chip is coupled to a memory chip pad of the external dynamic random access memory chip, a first terminal of the corrected termination impedance element is coupled to the memory chip pad, a second terminal of the corrected termination impedance element is coupled to a first voltage rail line in the external dynamic random access memory chip, a first terminal of the first termination impedance element is coupled to the pad, and a second terminal of the first termination impedance element is coupled to the second voltage rail line of the system on chip.

10. The correction method of termination impedance element as claimed in claim 9, wherein a voltage of the first voltage rail line is different from a voltage of the second voltage rail line.

11. The correction method of termination impedance element as claimed in claim 10, wherein the voltage of the first voltage rail line is a system voltage, and the voltage of the second voltage rail line is a ground voltage.

12. The correction method of termination impedance element as claimed in claim 8, wherein the step of correcting the impedance value of the first termination impedance element according to the impedance value of the corrected termination impedance element comprises:

measuring a first division voltage between the corrected termination impedance element and the first termination impedance element by the correction circuit; and adjusting the impedance value of the first termination impedance element correspondingly according to the first division voltage by the correction circuit.

13. The correction method of termination impedance element as claimed in claim 12, wherein the step of adjusting the impedance value of the first termination impedance element correspondingly according to the first division voltage comprises:

comparing the first division voltage with a reference voltage to obtain a comparison result; and adjusting the impedance value of the first termination impedance element correspondingly according to the comparison result.

14. The correction method of termination impedance element as claimed in claim 8, wherein the step of correcting the impedance value of the second termination impedance element according to the impedance value of the first termination impedance element further comprises:

comparing a voltage of the common node with a reference voltage to obtain a comparison result; and adjusting the impedance value of the second reference impedance element correspondingly according to the comparison result.

* * * * *